(12) United States Patent
Haensch et al.

(10) Patent No.: US 10,243,562 B2
(45) Date of Patent: Mar. 26, 2019

(54) LEVEL-SHIFTING CIRCUIT FOR NON-COMPLEMENTARY LOGIC

(71) Applicant: International Business Machines Corporation, Armonk, NY (US)

(72) Inventors: Wilfried Ernst-August Haensch, Somers, NY (US); Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/444,493

(22) Filed: Feb. 28, 2017

(65) Prior Publication Data

US 2018/0248550 A1    Aug. 30, 2018

(51) Int. Cl.
*H03L 5/00* (2006.01)
*H03K 17/687* (2006.01)
*H03K 17/30* (2006.01)
*H03K 19/0185* (2006.01)
*H03K 3/00* (2006.01)
*H01L 27/12* (2006.01)

(52) U.S. Cl.
CPC . *H03K 19/018507* (2013.01); *H01L 27/1255* (2013.01)

(58) Field of Classification Search
CPC ........ H03K 19/018507; H03K 19/003; H03K 4/83; H03K 19/0185; H01L 27/1255; H01L 29/745; H04B 5/00

USPC ............... 326/62, 63, 68, 80, 81; 327/333, 327/365–508; 365/189.11; 1/1
See application file for complete search history.

(56) References Cited

U.S. PATENT DOCUMENTS

| | | | | |
|---|---|---|---|---|
| 5,973,367 | A * | 10/1999 | Williams | ............ H01L 27/0629 257/133 |
| 6,075,391 | A * | 6/2000 | Tarantola | ............. H03K 17/063 327/111 |
| 7,427,887 | B2 * | 9/2008 | O'Donnell | ........... H03K 17/063 324/404 |
| 8,212,420 | B2 * | 7/2012 | Okanobu | ................ H03J 5/246 307/109 |
| 9,640,558 | B2 * | 5/2017 | Kimura | ................. G09G 3/3241 |
| 9,806,694 | B2 * | 10/2017 | Reedy | ..................... H03H 11/28 |
| 2004/0196089 | A1 * | 10/2004 | O'Donnell | ........... H03K 17/165 327/437 |

(Continued)

*Primary Examiner* — Brandon S Cole
(74) *Attorney, Agent, or Firm* — Harrington & Smith

(57) ABSTRACT

A voltage shifting circuit includes a first transistor in electrical parallel with a second transistor between an input node and an output node; a gate threshold capacitor disposed between the output node and a gate of the second transistor; and at least one of a) a downshift capacitor disposed between the input node and a drain/source of the first transistor, arranged to downshift a voltage from the input node and apply the downshifted voltage to the drain/source of the first transistor; and b) an upshift capacitor disposed between the input node and a drain/source of the second transistor, arranged to upshift a voltage from the input node and apply the upshifted voltage to the drain/source of the second transistor. This circuit is advantageously directly coupled to an input or output node of a non-complementary logic gate, of which multiple instances can be deployed in display circuitry or solar panels.

14 Claims, 9 Drawing Sheets

(56) References Cited

U.S. PATENT DOCUMENTS

| | | | | |
|---|---|---|---|---|
| 2006/0066644 A1* | 3/2006 | Yamaguchi | ............ | G09G 3/325 |
| | | | | 345/690 |
| 2007/0126486 A1* | 6/2007 | Lee | ........................ | H03K 3/012 |
| | | | | 327/218 |
| 2009/0108911 A1* | 4/2009 | Nakahara | ............. | H03K 17/063 |
| | | | | 327/434 |
| 2011/0148473 A1* | 6/2011 | Wu | ....................... | G11C 27/024 |
| | | | | 327/94 |
| 2011/0253989 A1* | 10/2011 | Ullmann | ............. | H01L 27/3265 |
| | | | | 257/40 |
| 2011/0260145 A1* | 10/2011 | Omary | ................. | C07D 401/04 |
| | | | | 257/40 |
| 2012/0286888 A1* | 11/2012 | Hsieh | ................... | H03B 5/1228 |
| | | | | 331/117 FE |

* cited by examiner

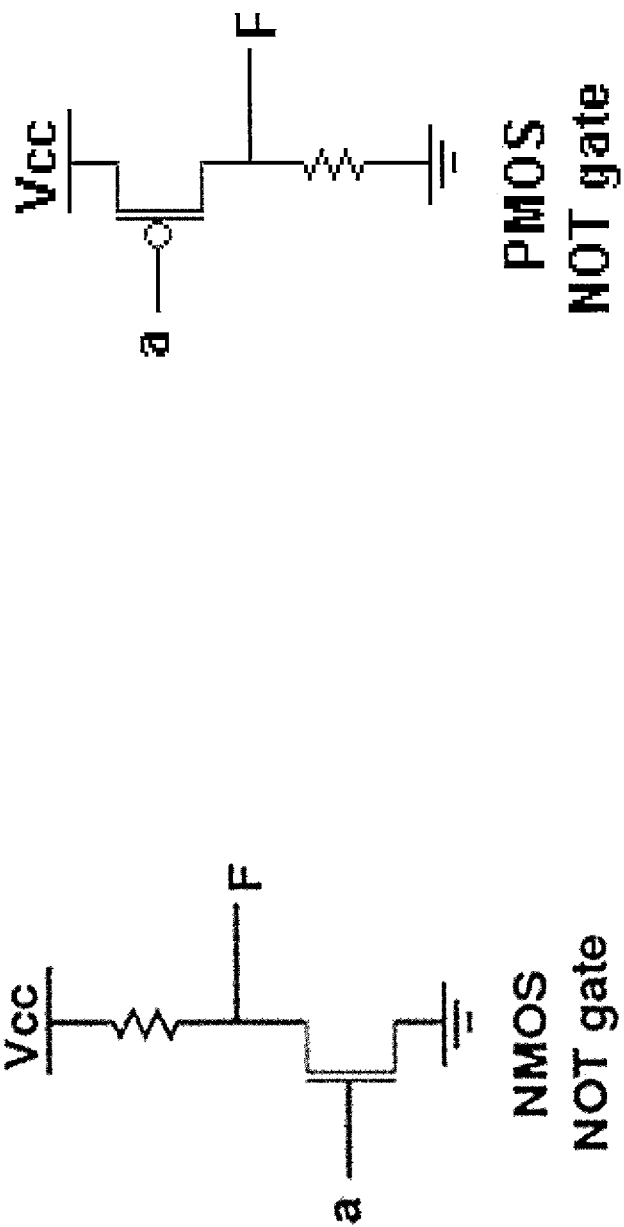

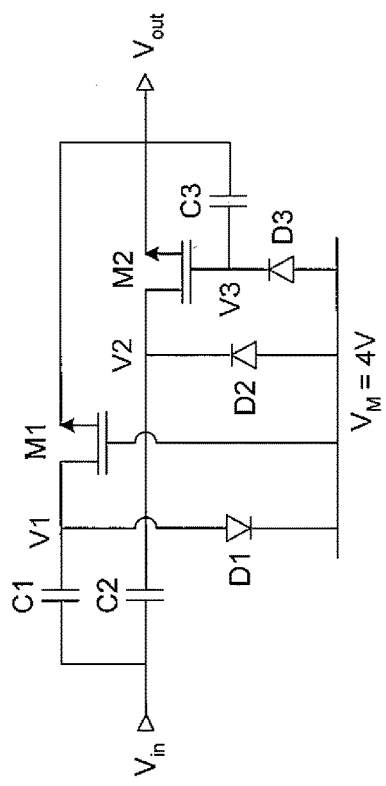
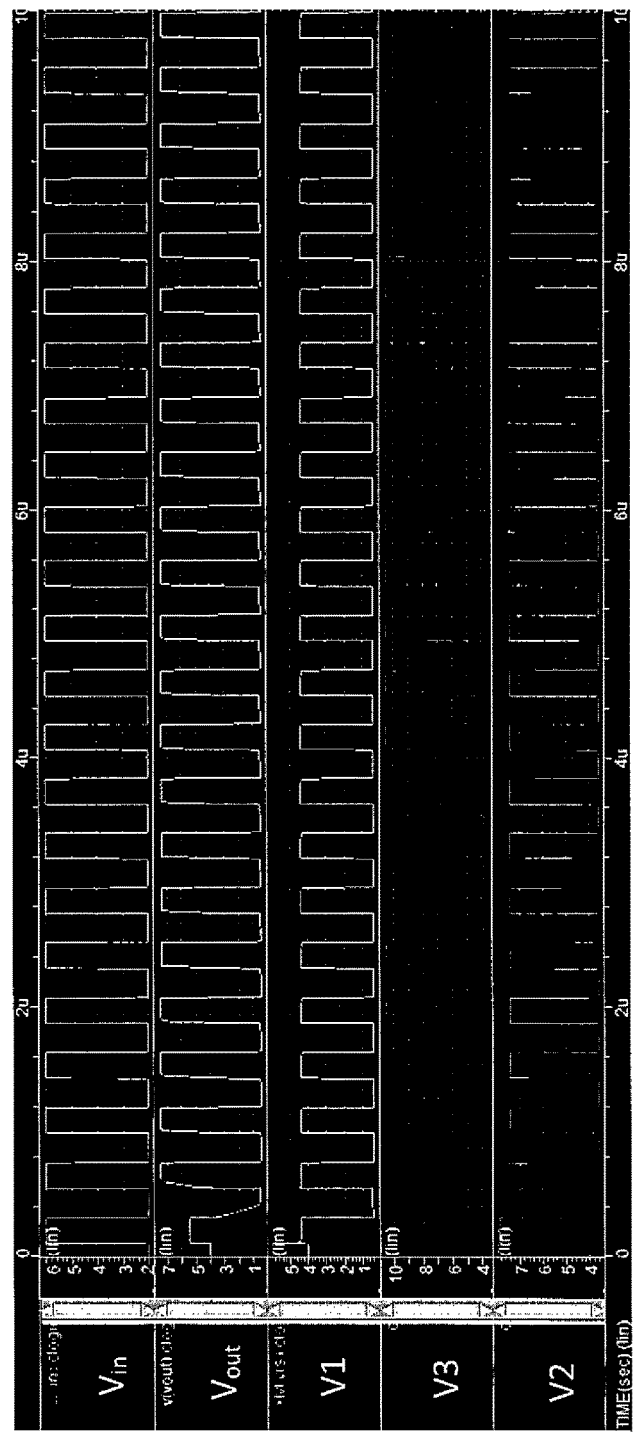
FIG. 4

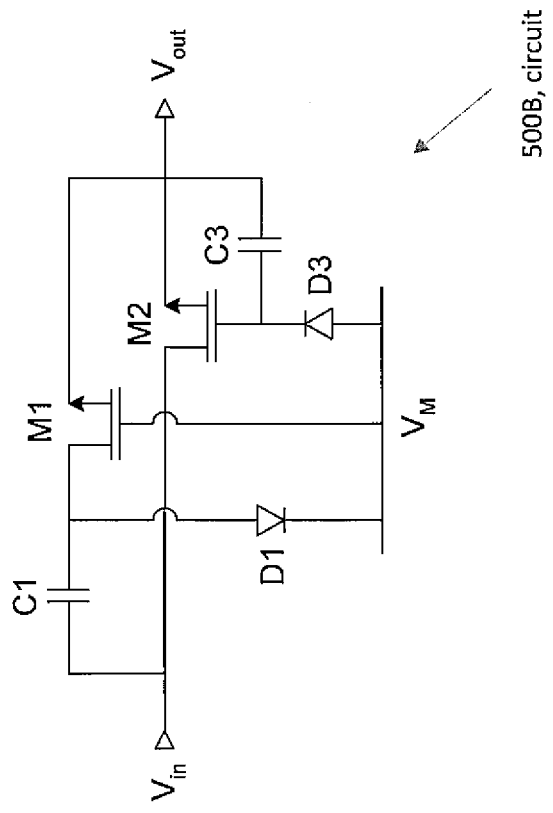
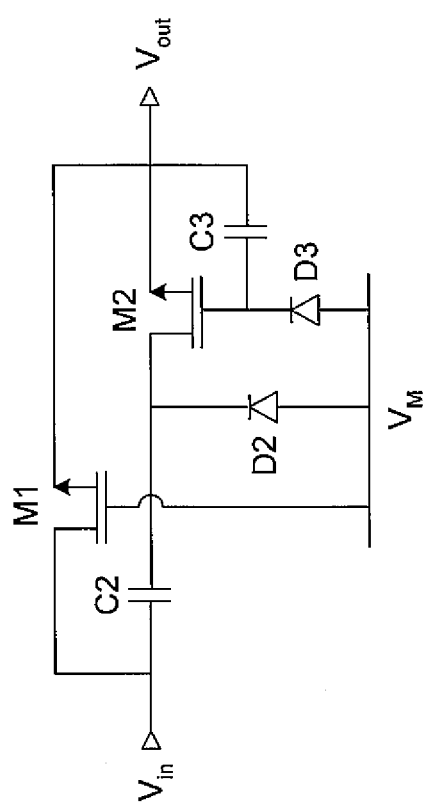
FIG. 5B
FIG. 5A

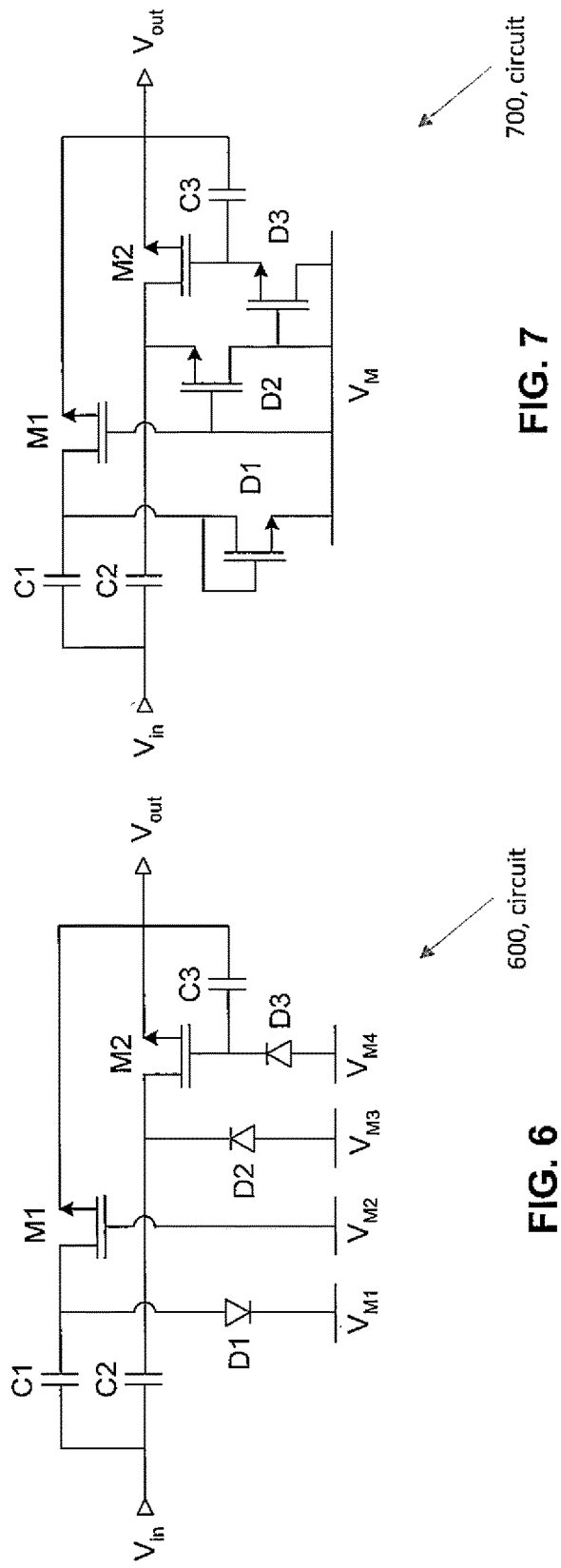

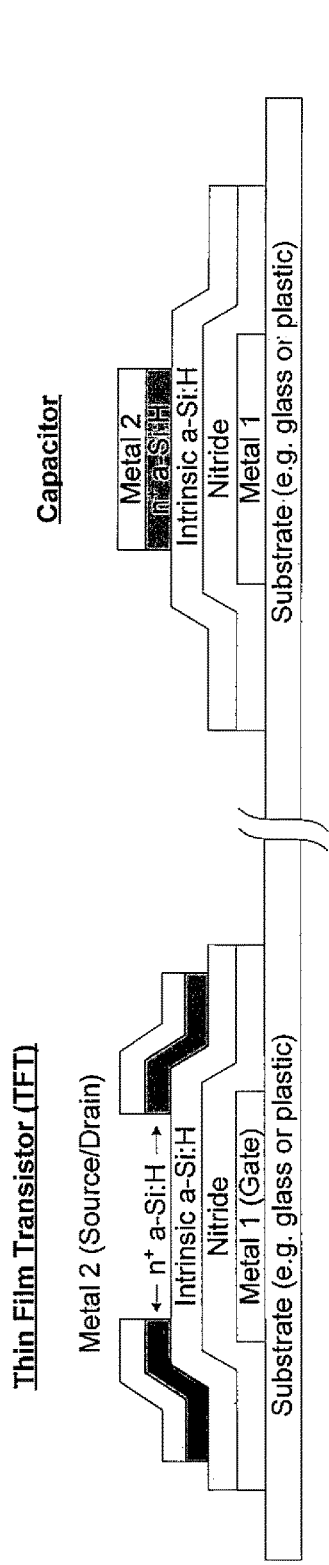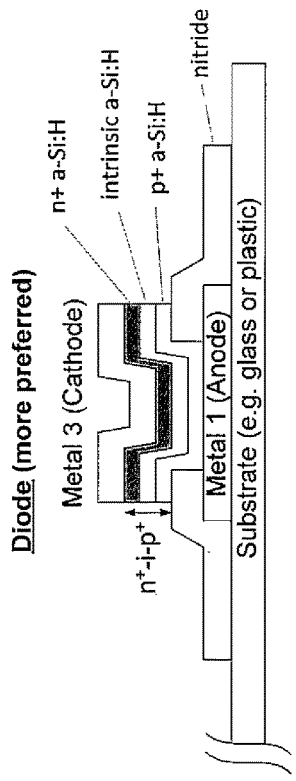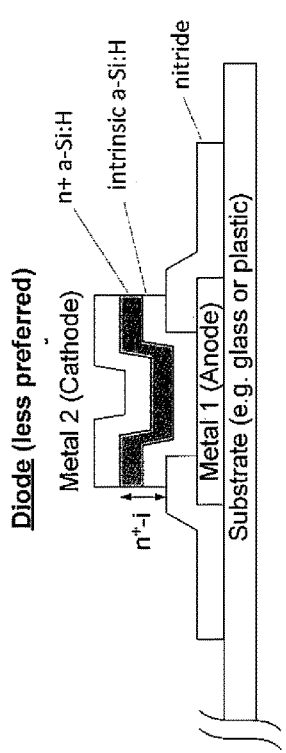
FIG. 8A
FIG. 8B
FIG. 8C

1002: pattern layers of different materials on a non-silicon substrate to form at least a first and second transistor, at least a first and second capacitor, and at least one further device interconnected with one another 1004: the first and second transistor are in electrical parallel with one another between an input node of the circuit and an output node of the circuit 1006: the second capacitor couples the output node to a gate of the second transistor 1008: the first capacitor in combination with the further device couples the input node to a drain of the first transistor or to a drain of the second transistor 1010: at least one of the different materials that is present in each of the first and second transistors and each of the first and second capacitors is one of
- hydrogenated amorphous silicon and
- an organic semiconductor and
- an amorphous metal-oxide semiconductor

LEVEL-SHIFTING CIRCUIT FOR NON-COMPLEMENTARY LOGIC

TECHNICAL FIELD

The exemplary embodiments of this invention relate generally to circuits made in non-complementary semiconductor material, and more specifically relate to voltage shifting circuits implemented in hydrogenated amorphous silicon, or organic semiconductors such as are commonly used for large graphical displays and solar cells.

BACKGROUND

Complementary metal-oxide-semiconductor (CMOS) logic has long been an essential technology for integrated circuits. CMOS transistors implemented for high performance can provide a full rail-to-rail swing while exhibiting very low power consumption. But there are a wide variety of field effect transistor (FET) and logic gate implementations that do not require such high performance and for these cost is often an increasingly stringent consideration. Visual displays and other large area/flexible electronics applications are examples of some typical lower performance but cost sensitive CMOS deployments. In many such lower performance deployments n-channel and p-channel FETs may not both be available, for example hydrogenated amorphous silicon (a-Si:H, often used in thin-film solar cells) metal-oxide and various organic thin-film transistors may support only n-FETs or p-FETS but not both on the same chip. Even where both n-FETs and p-FETs might be technically available such as with certain organic materials and low temperature polysilicon, the cost and complexity of integrating n-FETs with p-FETS on a chip can be significantly higher than implementing the necessary logic using only n-FETs or p-FETs.

There is also non-complementary logic and in this regard FIGS. 1A-B illustrate non-complementary NOT logic gates; FIG. 1A is a NMOS implementation and FIG. 1B a PMOS implementation. The input is marked a, and the inverted output is marked F; disposition of the resistor distinguishes the NMOS from the PMOS implementation of a NOT gate. This resistive-drain circuit uses a single transistor and so it can be fabricated at low cost, but the fact that current flows through the resistor in one or the other of the possible input states results in reduced switching (operating) speed and increased power consumption.

Further in the non-complementary category, FIG. 1C illustrates a pseudo NMOS-NOT gate that avoids the resistor along with its inherent drawbacks at the cost of an additional transistor.

More fundamentally, non-complementary logic typically lacks the full rail-to-rail swing that can be obtained by CMOS logic. FIG. 1D is the voltage transfer function for the pseudo NMOS-NOT circuit of FIG. 1C, and illustrates such an incomplete voltage swing in that $V_{OL}$ is always greater than ground voltage. It is this lack of full swing that can hamper the cascading of logic units with one another which is a typical practice for large-area and flexible electronics. As a result of this the sequential logic of cascaded non-complementary gates can in practice vary from what the idealized per-gate truth tables would predict across the sequence.

SUMMARY

In a first aspect thereof the embodiments of this invention provide a voltage shifting circuit comprising a first transistor in electrical parallel with a second transistor between an input node and an output node; a gate threshold capacitor disposed between the output node and a gate of the second transistor, and at least one of a) a downshift capacitor disposed between the input node and a drain or source of the first transistor, arranged to downshift a voltage from the input node and apply the downshifted voltage to the drain or source of the first transistor; and b) an upshift capacitor disposed between the input node and a drain or source of the second transistor, arranged to upshift a voltage from the input node and apply the upshifted voltage to the drain or source of the second transistor.

In a second aspect thereof the embodiments of this invention provide method for manufacturing a circuit, and such a method comprises patterning layers of different materials on a semiconductor substrate disposed on a carrier substrate having at least an insulating top portion to form at least a first and second transistor, at least a first and second capacitor, and at least one further device interconnected with one another. These interconnections are such that a) the first and second transistor are in electrical parallel with one another between an input node of the circuit and an output node of the circuit; b) the second capacitor couples the output node to a gate of the second transistor; and c) the first capacitor in combination with the further device couples the input node to a drain/source of the first transistor or to a drain/source of the second transistor. In some embodiments, at least one of the different materials that is present in each of the first and second transistors and each of the first and second capacitors is one of hydrogenated amorphous silicon, an amorphous metal-oxide semiconductor and an organic semiconductor.

These and other aspects are detailed with particularity below.

BRIEF DESCRIPTION OF THE DRAWINGS

FIG. 1A-B are respective circuit diagrams of a non-complementary logical NOT gate implemented as a n-channel (nMOS) and a p-channel (pMOS) NOT gate.

FIG. 4 is a table showing voltages for the level shifter of FIG. 3, with V1, V2 and V3 taken at the illustrated locations of the circuit.

FIG. 5A is a circuit diagram illustrating another embodiment of these teachings, similar to FIG. 3 but without downshifting the input voltage.

FIG. 5B is a circuit diagram illustrating another embodiment of these teachings, similar to FIG. 3 but without upshifting the input voltage.

FIG. 6 is a circuit diagram illustrating another embodiment of these teachings, similar to FIG. 3 but with original/independent $V_M$ supplies.

FIG. 7 is a circuit diagram illustrating another embodiment of these teachings, similar to FIG. 3 but with diode-connected transistors.

FIG. 8A is a sectional view of a transistor (TFT) and capacitor of a level shifter according to these-teachings with the TFT implemented in amorphous silicon.

FIGS. 8B-C illustrate sectional views of different implementations of a diode for the level shifter of FIG. 8A.

FIG. 10 is a process flow diagram illustrating certain steps for patterning some of the circuits described herein.

DETAILED DESCRIPTION

Figures 2, 3:
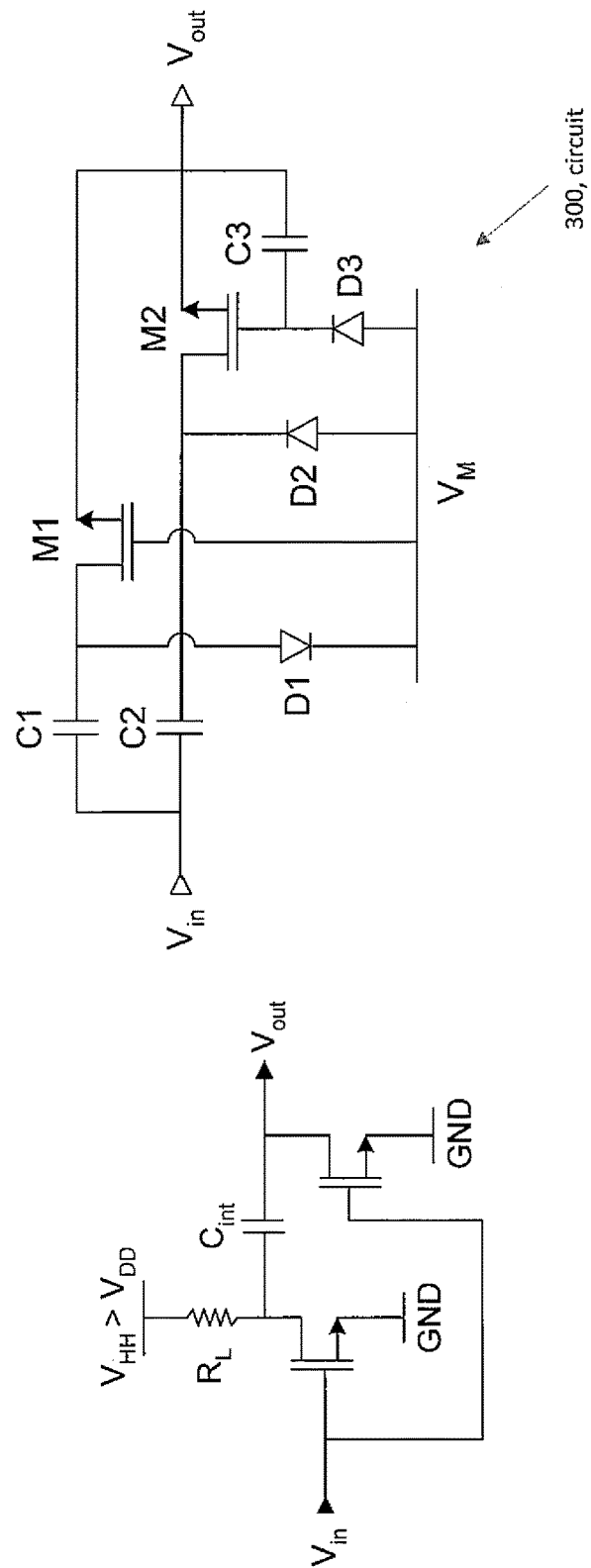
FIG. 2 is circuit diagram of a prior art level shifter with $V_{HH}>V_{DD}$ bootstrapping to boost the signal level.
FIG. 3 is a circuit diagram of a level shifter according to an embodiment of these teachings, for which this example is specifically an n-MOS level shifter.

One possible solution to the problem of non-complementary logic gates detailed above is to use a level shifter circuit such as that shown at FIG. 2 with some form of bootstrapping to boost the output signal. For the FIG. 2 implementation that bootstrapping is implemented by setting $V_{HH} > V_{DD}$ but another implementation could for example set $V_{SS} < GND$ to achieve an equivalent output. While the FIG. 2 level shifter is a simple design, the presence of the resistor $R_L$ means this circuit will either impose high power consumption or low speed: speed is not compromised too much if $R_L$ is small but power consumption is high, whereas a high $R_L$ value will result in lesser power consumption but slower response.

FIG. 3 is a circuit diagram showing one implementation of a voltage level-shifting circuit 300 according to these teachings. The intent is to boost the output voltage of the non-complementary logic unit to compensate for the lack of full swing, without imposing excessively high power consumption or low operation speed. It should be understood that the disclosed embodiments are merely illustrative of the claimed structures and methods that may be embodied in various forms. The structures and methods disclosed herein may be embodied in many different forms and should not be construed as limited to the exemplary embodiments set forth herein. FIGS. 5A-B and 6-7 illustrate alternative embodiments but these are also non-limiting examples, and certain features of them may be combined with one another. For example, either of the FIG. 6 or 7 embodiment can be combined with the singular upshift or downshift capacitor embodiment of respective FIGS. 5A-B; or the multiple diode supplies of the FIG. 6 embodiment may be combined with the diode-connected thin film transistors (TFTs) of the FIG. 7 embodiment.

Returning to the FIG. 3 embodiment, input voltage $V_{in}$ and output voltage $V_{out}$ of the voltage level-shifting circuit 300 are self-explanatory. There are two thin film transistors (TFTs) M1 and M2 connected in electrical parallel between those input and output nodes. A first or downshift capacitor C1, in combination with a first diode D1 and supply voltage $V_M$, downshifts the DC level of the input voltage $V_{in}$ which is applied to the drain of the first transistor M1. The DC level of the input voltage $V_{in}$ is downshifted such that the upper level of the downshifted voltage applied to the drain of M1 is close to $V_M$ (more specifically, approximately equal to $V_M$ plus the turn-on voltage of the diode D1 which is typically in the range of 0.2-1V). The supply voltage $V_M$ is applied directly to the gate of the first transistor M1, whose source is directly coupled to the output voltage $V_{out}$.

A second or upshift capacitor C2, in combination with the second diode D2 and the supply voltage $V_M$, upshifts the DC level of the input voltage $V_{in}$ which is applied to the drain of the second transistor M2. The DC level of the input voltage $V_{in}$ is upshifted such that the lower level of the upshifted voltage applied to the drain of M2 is close to $V_M$ (more specifically, approximately equal to $V_M$ minus the turn-on voltage of the diode D2 which is typically in the range of 0.2-1V). The source of the second transistor M2 is also directly coupled to the output voltage $V_{out}$. Gate voltage for the gate of the second transistor M2 is applied from the voltage source $V_M$ via a third diode D3; and a third capacitor C3 couples the sources of both transistors M1 and M2 (i.e. the output voltage, $V_{out}$) to the gate of the second transistor M2 and so the gate threshold voltage for M2 is stored across the third, or gate threshold, capacitor C3. As a result, the amplitude of the voltage applied to the gate of the transistor M2 (i.e. the difference between its upper level and lower level) is increased by approximately the gate threshold voltage of M2 compared to the amplitude of the input voltage $V_{in}$, and the lower level of the voltage applied to the gate of the transistor M2 becomes approximately equal to $V_M$.

The circuit of FIG. 3 transfers the upper level of the up-shifted input signal $V_{in}$ (which is applied to the drain of M2), and the lower level of the down-shifted input signal $V_{in}$ (which is applied to the drain of M1), to the output voltage $V_{out}$. As will be further detailed for the embodiments shown at FIGS. 5A-B and 6-7: the circuit may be implemented with either the upshifting components (C2 and D2) or the down-shifting components (C1 and D1) but not-both; there may be more than one voltage supply $V_M$ in order to bias a gate or gates or the amount of voltage upshift/downshift; and/or any one or more of the diodes D1-D3 may be implemented as a transistor with source and drain connected which the FIG. 7 embodiment implements by shorting the drain to the gate.

FIG. 4 is a simulated plot of $V_{in}$, $V_{out}$, and V1-V3 for the circuit of FIG. 3, which for convenience is reproduced at the upper left of FIG. 4 with added annotations to show the locations for V1-V3. The values of the capacitors used for the simulation are C1=C2=2 pF and C3=20 pF. The simulated transistors M1 and M2 have a channel width-to-length ratio (W/L) of 200 µm/5 µm=40 and a threshold voltage of 3V. As the chart shows the input voltage range is 2V-6V. Discounting the first few cycles during which the circuit has not yet reached steady state (this is because the initial electrical charge stored across the capacitors at the beginning of the simulation was chosen to be zero), it can be seen that all values at V1-V3 cycle with the input voltage $V_{in}$ as well as the output voltage $V_{out}$, so when the input voltage $V_{in}$ is high the output voltage as well as the voltage at every one of V1-V3 are also high. The voltage at V1 cycles between about 0.5V and 4.5V and this reflects a DC-level downshift of the 2-6V input signal. The voltage at V2 cycles between about 3.5V and 7.5V and this reflects a DC-level upshift of the 2-6V input signal. As can be seen from the values for V3 applied to the gate of the transistor M2 vary to up to about 10.5V, which per the circuit diagram is approximately the sum of $V_M$=4V, plus the amplitude of $V_{in}$ (i.e. 4V), plus the voltage released by the third capacitor C3 (i.e. 3V), minus the turn-on voltage of the diode D3 (approximately 0.5V in this simulation example). The end result is that for $V_{out}$ the value of V1 dominates the lower range at about 0.5V and the value of V2 dominates the upper range at about 7.5V, expanded on both ends over the $V_{in}$ range of 2V-6V.

The embodiment at FIG. 5A is similar to that of FIG. 3 except that this implementation of the level-shifting circuit 500A utilizes only the up-shift components C2 and D2 and does not include the down-shift components C1 and D1. Extending the quantitative example of FIG. 4, the circuit 500A at FIG. 5A would expand the input voltage $V_{in}$ range of 2-6V to an output voltage $V_{out}$ range of about 2V-7.5V.

The embodiment at FIG. 5B is similar to that of FIG. 3 except that this implementation of the level-shifting circuit 500B utilizes only the down-shift components' C1 and D1 and does not include the up-shift components C2 and D2. Extending the quantitative example of FIG. 4, the circuit 500A at FIG. 5A would expand the input voltage $V_{in}$ range of 2-6V to an output voltage $V_{out}$ range of about 0.5V-6V.

The embodiment of FIG. 6 is similar to that of FIG. 3 except in this implementation there are multiple supply voltages $V_M$ for the circuit 600, namely a different first supply voltage $V_{M1}$ for the lower level of the downshifted $V_{in}$ voltage which can be used to alter the downshifted voltage, a second supply voltage $V_{M2}$ applied to the gate of the first transistor M1 to bias that gate, a third supply voltage $V_{M3}$ applied to the drain of the second transistor M2 via the second diode D2 which can be used to alter the upshifted voltage, and a fourth supply voltage $V_{M4}$ applied to the gate of the second transistor via the third diode D3 to bias that gate. While FIG. 6 illustrates four different supply voltages, the reader will understand an embodiment can have less than four different supply voltages.

The embodiment of FIG. 7 is similar to that of FIG. 3 except in this implementation the diodes of the circuit 700 are replaced by connected transistors (TFTs), each with their gate shorted to their respective gate so as to serve the same function of a transitional diode in restricting current flow to only one direction. While it is more economical to produce a circuit according to these teachings with either all diodes as shown at FIGS. 3, 5A-5B and 6, or all connected-TFTs as FIG. 7 illustrates, this is an economic constraint and not a technical limit to these teachings and so some embodiments may have one but fewer than all diodes implemented as a connected TFT. More practically, the diodes illustrated at the other embodiments of the circuit 300, 500A, 500B and 600 may be implemented as connected transistors.

Additionally, while the circuit diagrams at FIGS. 3 through 7 are drawn to n-channel transistors, it will be appreciated by those skilled in the semiconductor arts that these circuits may be implemented using p-channel transistors as well. In this regard the circuit connections to the transistor drains described above for these Figures would be connected to the transistor sources in the case of p-channel implementation.

As stated above, one practical implementation for circuits according to these teachings is a large area electronics such as graphical display devices. Unhydrogenated amorphous silicon (a-Si) generally has a high defect ratio and so it has become routine to integrate hydrogenated amorphous silicon (a-Si:H) TFTs and capacitors for such display applications. Stacks of p-type/intrinsic/n-type (p-i-n) a-Si:H based materials are also commonly used for solar cells. The general principles of silicon wafer manufacture such as doping, vapor deposition, masking and chemical etching are well known in the semiconductor arts and need not be revisited here since those conventional fabrication techniques are suitable for building out the circuits described herein. FIGS. 8A-C and 9A-C detail more specific considerations when using such known fabrication methods to create embodiments of the circuits of these teachings.

FIGS. 8A-C detail some specific considerations for creating transistors, capacitors and diodes with hydrogenated amorphous silicon. FIG. 8A illustrates a sectional view of a transistor and a capacitor formed in a-Si:H, while FIGS. 8B-C illustrate alternatives for forming the diode. If the diode is to be implemented as diode rather than a connected TFT as in FIG. 7, the reader will appreciate that all of FIG. 8A and either of FIG. 8B can be formed on a common substrate as part of an overall process for making a semiconductor chip/wafer that embodies one or more implementations of the circuit according to these teachings.

For the transistor FIG. 8A illustrates the transistor gate (first metal layer) disposed on the substrate (glass or plastic preferably, although metal foil coated with insulating materials such as oxide or nitride may be used in some embodiments), followed by a nitride layer, an intrinsic a-Si:H layer, and source and drain implemented identically as an n-doped a-Si:H layer and a second metal layer. For the capacitor FIG. 8A illustrates the first metal layer disposed on the substrate, followed by the nitride layer, the intrinsic a-Si:H layer, and the layer of n-doped a-Si:H capped by the second metal layer. The devices are generally distinguished on the chip by masking and etching as is well known in the art.

Now consider FIG. 8B which illustrates a sectional view of a diode. Performance of the transistor is sensitive to the interface between the a-Si:H layer and the nitride layer. For this reason it is preferable not to interrupt the TFT stack deposition sequence, which is typically performed without breaking the vacuum, and deposit the diode stack afterwards. For all practical purposes this can be done with only one additional masking step. The preferred diode structure is p-i-n which is the diode of FIG. 8B. FIG. 8B illustrates for the diode the first metal layer that operates as the anode and which is disposed on the substrate, followed by the nitride layer, with the intrinsic a-Si:H layer sandwiched between a p-doped a-Si:H layer and an n-doped a-Si:H layer, all capped by a further metal layer that operates as the cathode. This further metal layer may be the same metal material as the second metal layer at FIG. 8A, but FIG. 8B shows it to be a different third metal material.

In principle either or both of the n or p layers of the p-i-n diode shown at FIG. 8B may be omitted to form a Schottky diode, and FIG. 8C shows an embodiment of this specifically with the p layer removed. If the p-layer (or n-layer) is omitted from the diode, the work-function of the first metal layer (anode) or the capped metal layer (cathode) will set the band bending at the respective side of the junction. In that case there is no need to use a third metal material for the cathode and the same second metal layer used in the capacitor and transistor of FIG. 8A can be used in the non p-i-n diode implementation as FIG. 8C shows.

While it is preferred that the transistor deposition stack not be interrupted, there is a viable option to formulate that transistor while interrupting its stack deposition. In such a case the TFT deposition would be interrupted to pattern the nitride layer in the diode of FIG. 8B or 8C after which the nitride layer of the transistor will need rigorous cleaning before deposition of the intrinsic a-Si:H layer of the transistor to ensure the interface between them is not compromised.

Figure 9A:
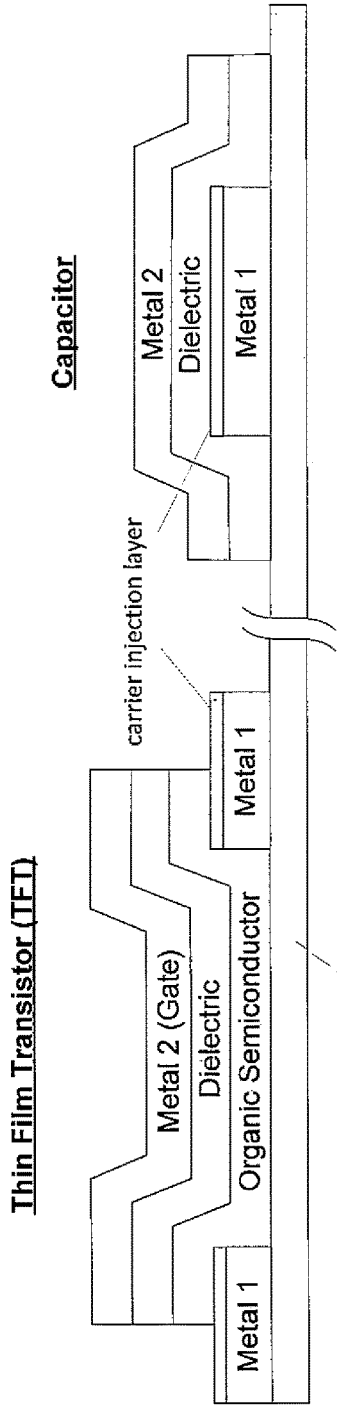
FIG. 9A is a sectional view of a transistor (TFT) and capacitor of a level shifter according to these teachings with the TFT implemented in an organic semiconductor such as pentacene.
Figure 9B:
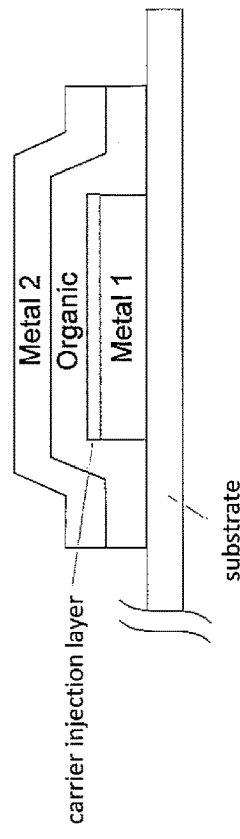
FIGS. 9B-C illustrate sectional views of different implementations of a diode for the level shifter of FIG. 9A.
Figure 9C:
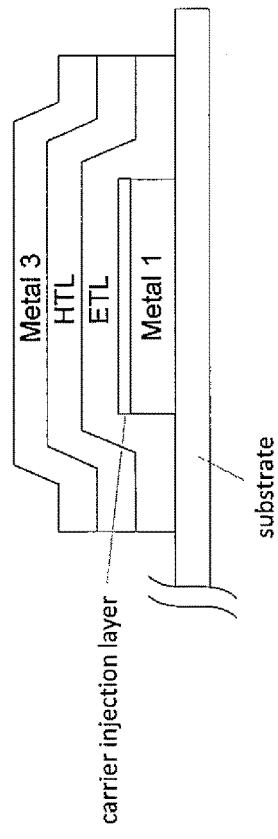

FIGS. 9A-C detail some specific considerations for creating transistors, capacitors and diodes with an organic semiconductor. In general organic semiconductors are characterized by organic materials that exhibit semiconductor properties at the molecular level or in molecular chains which depending on the material can be short or long polymer chains. For example; pentacene, rubrene and anthracene are considered small molecule semiconductors while fullerene and its derivatives are considered large molecule semiconductors.

The source and drain of the transistor at the left of the FIG. 9A sectional drawing is shown as the metal 1 layer. A dielectric layer is disposed atop the organic semiconductor layer between them that operates as the channel, and the stack is capped with another metal layer that operates as the gate. This source/drain metal may be functionalized with a carrier injection layer as shown, for example with self-assembled mono-layers or alkaline ions such as $Ca^+$, to reduce or otherwise modify the work-function for enhanced carrier injection into the pentacene or other organic semiconductor. In this regard a high workfunction or other suitable workfunction can be chosen for the gate metal to reduce the threshold voltage of the transistor.

The capacitor at the right of FIG. 9A is implemented with the same arrangement of layers as the transistor, except it is masked to prevent deposition of the organic semiconductor layer.

FIGS. 9B-9C illustrate sectional views of two different implementations of a diode with an organic semiconductor. In the FIG. 9B diode embodiment the same organic material as the transistor channel is used to form the diode. In this regard the organic semiconductor pentacene may be sandwiched between the metal 2 layer having a high workfunction and the metal 1 layer having a low work function. In the FIG. 9C diode embodiment the organic material used for the transistor channel is etched away and a more sophisticated structure is shown, specifically a high work-function metal/hole-transport-layer (HTL) interfaced with an electron-transport-layer (ETL), atop a low-workfunction electrode implemented as the metal 1 layer.

The embodiments above can be more generally described as a voltage shifting circuit comprising a first transistor M1 in electrical parallel with a second transistor M2 between an input node $V_{in}$ and an output node $V_{out}$. This circuit further includes a gate threshold capacitor C3 disposed between the output node $V_{out}$ and a gate of the second transistor M2; and the circuit has at least one of a) a downshift capacitor C1 disposed between the input node $V_{in}$ and a drain (or source) of the first transistor M1 that is arranged to downshift a voltage from the input node $V_{in}$ and apply the downshifted voltage to the drain (or source) of the first transistor M1; and b) an upshift transistor C2 disposed between the input node $V_{in}$ and a drain (or source) of the second transistor, arranged to upshift a voltage from the input node $V_{in}$ and apply the upshifted voltage to the drain (or source) of the second transistor M2.

In more specific embodiments the circuit is implemented as non-complementary metal oxide semiconductor, and the specific but not limiting examples of this had the circuit implemented using hydrogenated amorphous silicon (FIGS. 8A-C) and using an organic semiconductor (FIGS. 9A-C).

Further to the circuit itself, in some embodiments where the circuit comprises at least the downshift capacitor C1, the downshifted voltage from that downshift capacitor C1 is applied to a gate of the first transistor M1; see FIGS. 3, 5B and 7. In some of these embodiments the circuit included both the downshift capacitor C1 and the upshift capacitor C2; see FIG. 3. In certain embodiments where the circuit includes at least the upshift capacitor C2, gate voltage applied to a gate of the first transistor M1 is independent of that upshifted voltage from the upshift capacitor C2; see FIGS. 5A and 6.

In some of the specifically described embodiments, supply voltage $V_M$ for the circuit is applied to the gate of the second transistor M2 via a diode D3 or via a connected transistor D3 having its drain connected to its gate; see for example FIGS. 3, 5B and 7. More particularly, at those same drawing figures the (same) supply voltage $V_M$ is further applied to the drain/source of the second transistor M2 via a further diode D2 or via a further connected transistor D2. FIG. 6 makes clear that in some embodiments there can be a different supply voltage $V_{M3}$ applied to the drain/source of the second transistor M2 via that further diode D3 or further connected transistor D3, while in other embodiments a still different supply voltage $V_{M2}$ can be applied to the gate of the first transistor M1 via a still further diode D1 or via a still further connected transistor D1.

Figure 1D:
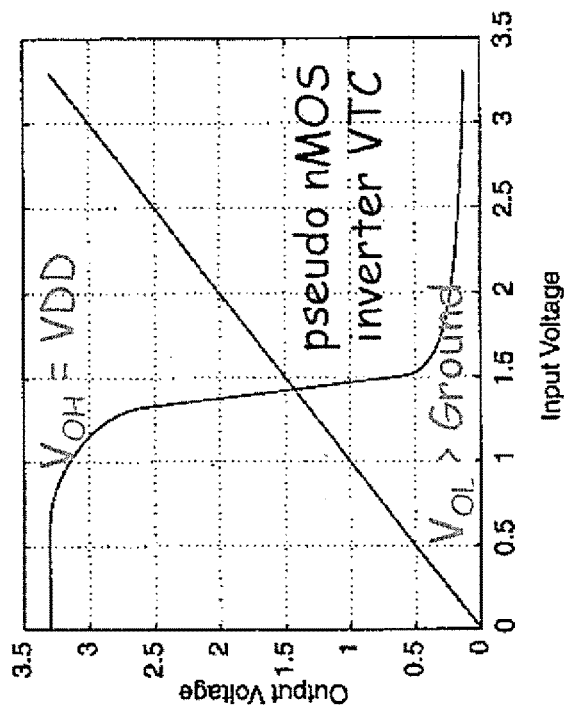
FIG. 1D is a plot of input voltage versus output voltage for the pseudo-NMOS NOT gate of FIG. 1C.
Figure 1C:
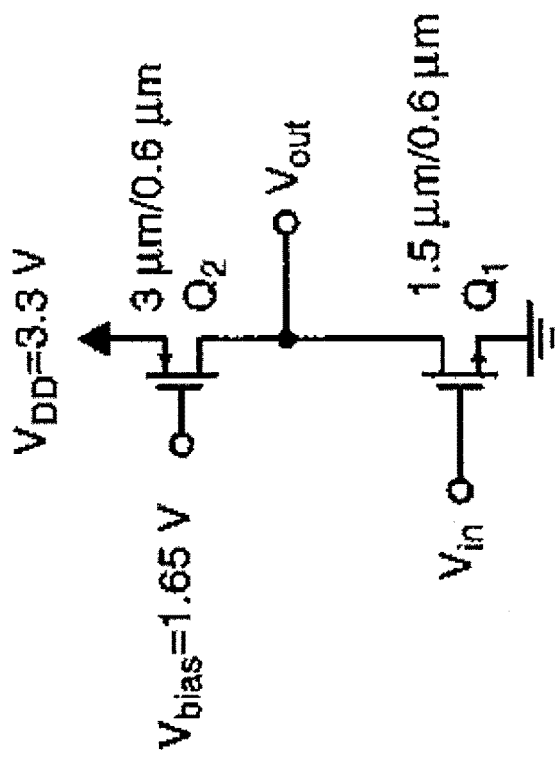
FIG. 1C is a circuit diagram of a conventional pseudo-nMOS logical NOT gate.

One motivation behind the inventors in creating such a level shifting circuit is for providing a full rail-to-rail swing, or at least an improved voltage swing, for input to a non-complementary logic gate. There are a variety of such logic gates well known in the art, and as one example FIG. 1C illustrates a non-complementary NOR gate having a logic gate input node $V_{in}$. In this regard a circuit according to these teachings may be deployed in combination with one or more non-complementary logic gates such that the logic gate input node is electrically coupled to the output node Vow of the voltage shifting circuit, directly such that there are no further electrical devices between them. The non-complementary logic gate can also be coupled such that the logic gate output node is directly coupled to the input node $V_{in}$ of the level shifting circuit. In other embodiments multiple non-complementary logic gates can be coupled to a single instance of the level shifting circuit in either of these manners. Such paired circuitry may be advantageously deployed within graphical display circuitry, or it may be disposed in a solar cell.

FIG. 10 is a process flow diagram illustrating certain steps for manufacturing some of the circuits described herein. The specifics for patterning layers via masking, etching, deposition of material and other conventional fabrication steps to form devices and electrical interconnections between them to form a circuit are well known in the semiconductor chip-making art and not revisited here except as pertains to the specifics of these teachings. In this regard FIG. 10 begins at block 1002 by patterning layers of different materials on a semiconductor substrate disposed on a carrier substrate to form at least a first and second transistor shown in the drawings as M1 and M2, at least a first and second capacitor shown in the drawings as either C1 or C2 as the first capacitor and C3 as the second capacitor, and at least one further device shown in the device as either D1 or D2. As least a top portion of the carrier substrate is insulating. In some embodiments, the carrier substrate is comprised of glass or plastic. In other embodiments, the carrier substrate may be comprised of a metal or semiconductor material with an insulator layer disposed on top of it. In this patterning at step 1002 conductive interconnects are formed to interconnect these devices with one another as set forth at blocks 1004, 1006 and 1008. Block 1004 has the first and second transistors M1 and M2 in electrical parallel with one another between an input node $V_{in}$ of the circuit and an output node $V_{out}$ of the circuit. Block 1006 has the second capacitor C3 coupling the output node $V_{out}$ to a gate of the second transistor M2. And block 1008 has the first capacitor in combination with the further device coupling the input node to a drain of the first transistor or to a drain of the second transistor. In the circuit diagrams block 1008 is represented by C1 in combination with D1 coupling to the drain of M1, or by C2 in combination with D2 coupling to the drain of M2. Finally block 1010, in combination with the semiconductor substrate on a carrier substrate at block 1002 which in the drawing is glass or plastic; namely, in some embodiments at least one of the different materials that is present in each of the first and second transistors and each of the first and second capacitors is either a-Si:H or an organic semiconductor. In other embodiments, other semiconductor materials such as amorphous metal-oxide semiconductors or 2D semiconductors may be used.

In some of the embodiments described above that further device at block 1002 is a diode, while in others such as FIG. 7 it was a further transistor having its gate shorted to its drain. For some embodiments where it was a diode, the at least one different material that block 1010 refers to was hydrogenated amorphous silicon and that material was also present in the diode as FIGS. 8B-C illustrate. In those embodiments when the layers are patterned to form the devices there is an interruption in the forming of the first and second transistors in order to perform an additional masking step for patterning the diode of FIG. 8B or 8C, and during this interruption and additional diode masking step a vacuum is continuously sustained over the first and second transistors which at that juncture are not yet fully formed.

In some embodiments such as the examples shown at FIGS. 9B-C the further device of block 1002 is a diode and the at least one different material that block 1010 refers to was an organic semiconductor. Specific for the FIG. 9C embodiment, that organic semiconductor material is not present in the completed diode but rather all of the organic semiconductor material is etched away from the diode and in its place is disposed a hole transport layer (HTL) interfaced with an electron transport layer (ETL) to form the diode.

Where the circuit is a level shifting circuit as more particularly detailed above it may be advantageously deployed with one or more non-complementary logic gates such that the input node of one of the gate or circuit is connected to the output node of the other of the gate or circuit. Such logic gates are also formed on the same substrate and simultaneously in which case patterning the layers at block 1002 further forms that logic gate such that an output node of the logic gate is directly conductively coupled to the input node of the circuit; and/or an input node of the logic gate is directly conductively coupled to the output node of the circuit.

In the foregoing description, numerous specific details are set forth, such as particular structures, components, materials, dimensions, processing steps, and techniques, in order to provide a thorough understanding of the exemplary embodiments disclosed herein. However, it will be appreciated by one of ordinary skill of the art that the exemplary embodiments disclosed herein may be practiced without these specific details. Additionally, details of well-known structures or processing steps may have been omitted or may have not been described in order to avoid obscuring the presented embodiments.

The description of the present invention has been presented for purposes of illustration and description, but is not intended to be exhaustive or limiting in the form disclosed. Many modifications and variations will be apparent to those of ordinary skill in the art without departing from the scope of the invention. The embodiments were chosen and described in order to best explain the principles of the invention and the practical applications, and to enable others of ordinary skill in the art to understand the invention for various embodiments with various modifications as are suited to the particular uses contemplated.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As such, various modifications and adaptations may become apparent to those skilled in the relevant arts in view of the foregoing description, when read in conjunction with the accompanying drawings and the appended claims. As but some examples, the use of other similar or equivalent vulnerability types may be used by those skilled in the art. However, all such and similar modifications of the teachings of this invention will still fall within the scope of this invention.

What is claimed is:

1. A voltage shifting circuit comprising:
   a first transistor in electrical parallel with a second transistor between an input node and an output node;
   a gate threshold capacitor disposed between the output node and a gate of the second transistor; and at least one of
   a downshift capacitor disposed between the input node and a drain or source of the first transistor, arranged to downshift a voltage from the input node and apply the downshifted voltage to the drain or source of the first transistor; and
   an upshift capacitor disposed between the input node and a drain or source of the second transistor, arranged to upshift a voltage from the input node and apply the upshifted voltage to the drain or source of the second transistor;
   wherein the gate threshold capacitor couples a source of the first transistor and a source of the second transistor such that a gate threshold voltage is stored across the gate threshold capacitor to increase a voltage swing of the output node relative to the input node.

2. The circuit according to claim 1, implemented as non-complementary metal oxide semiconductor.

3. The circuit according to claim 2, wherein the circuit is implemented using hydrogenated amorphous silicon.

4. The circuit according to claim 2, wherein the circuit is implemented using an organic semiconductor.

5. The circuit according to claim 1, comprising at least the downshift capacitor and wherein the downshifted voltage is applied to a gate of the first transistor.

6. The circuit according to claim 5, comprising both the downshift capacitor and the upshift capacitor.

7. The circuit according to claim 1, wherein supply voltage is applied to the gate of the second transistor via a diode or via a connected transistor having its drain connected to its gate.

8. The circuit according to claim 7, wherein the supply voltage is further applied to the drain or source of the second transistor via a further diode or via a further connected transistor.

9. The circuit according to claim 1, further comprising a non-complementary logic gate comprising a logic gate output node that is electrically directly coupled to the input node of the voltage shifting circuit and/or a logic gate input node that is electrically directly coupled to the output node of the voltage shifting circuit.

10. The circuit and non-complementary logic gate according to claim 9, disposed within graphical display circuitry.

11. The circuit and non-complementary logic gate according to claim 9, disposed in a solar cell.

12. The circuit according to claim 1 characterized by absence of any active resistor.

13. A method for manufacturing a circuit comprising:
patterning layers of different materials on a semiconductor substrate disposed on a carrier substrate having at least an insulating top portion to form at least a first and second transistor, at least a first and second capacitor, and at least one further device interconnected with one another such that:
the first and second transistor are in electrical parallel with one another between an input node of the circuit and an output node of the circuit;
the second capacitor couples the output node to a gate of the second transistor; and
the first capacitor in combination with the further device couples the input node to a drain or source of the first transistor or to a drain or source of the second transistor;
wherein at least one of the different materials that is present in each of the first and second transistors and each of the first and second capacitors is one of hydrogenated amorphous silicon, an amorphous metal-oxide semiconductor and an organic semiconductor;
and wherein the gate threshold capacitor couples a source of the first transistor and a source of the second transistor such that a gate threshold voltage is stored across the gate threshold capacitor to increase a voltage swing of the output node relative to the input node.

14. The method according to claim 13, further comprising:
patterning layers of the different materials on the non-silicon substrate to further form a non-complementary logic gate interconnected with the circuit such that:
an output node of the logic gate is directly conductively coupled to the input node of the circuit; and/or
an input node of the logic gate is directly conductively coupled to the output node of the circuit.

* * * * *